US011167474B2

(12) United States Patent
Schmidt et al.

(10) Patent No.: US 11,167,474 B2
(45) Date of Patent: Nov. 9, 2021

(54) STRUCTURES FORMED FROM HIGH TECHNOLOGY CONDUCTIVE PHASE MATERIALS

(71) Applicant: HAMILTON SUNDSTRAND CORPORATION, Charlotte, NC (US)

(72) Inventors: Wayde R. Schmidt, Pomfret Center, CT (US); Paul Sheedy, Bolton, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 695 days.

(21) Appl. No.: 15/637,321

(22) Filed: Jun. 29, 2017

(65) Prior Publication Data
US 2019/0001554 A1 Jan. 3, 2019

(51) Int. Cl.
| | |
|---|---|
| *H01B 1/02* | (2006.01) |
| *H01B 1/04* | (2006.01) |
| *B29C 64/141* | (2017.01) |
| *B22F 3/00* | (2021.01) |
| *C01B 32/168* | (2017.01) |
| *C23C 16/34* | (2006.01) |
| *H01B 1/14* | (2006.01) |
| *H01B 1/20* | (2006.01) |
| *C08K 9/08* | (2006.01) |
| *B29C 44/06* | (2006.01) |

(52) U.S. Cl.
CPC ............ *B29C 64/141* (2017.08); *B22F 3/002* (2013.01); *C01B 32/168* (2017.08); *C08K 9/08* (2013.01); *C23C 16/342* (2013.01); *H01B 1/02* (2013.01); *H01B 1/04* (2013.01); *H01B 1/14* (2013.01); *H01B 1/20* (2013.01); *B29C 44/065* (2013.01); *C01B 2202/28* (2013.01)

(58) Field of Classification Search
CPC .......... B82Y 30/00; B82Y 40/00; H01B 1/04; H01B 1/02; H01B 11/18; H01B 13/0036; H01B 1/023; H01B 1/14; H01B 1/20; H01B 1/22; H01B 1/24; H01B 3/002; H01B 3/004; H01B 3/087; H01B 3/47; H01B 5/14; H01B 7/046; H01B 7/32
See application file for complete search history.

(56) References Cited

U.S. PATENT DOCUMENTS

| | | | |
|---|---|---|---|
| 4,132,828 A | 1/1979 | Nakamura et al. | |
| 4,808,481 A | 2/1989 | Luxon | |
| 4,983,456 A | 1/1991 | Iwaskow et al. | |
| 7,448,441 B2 | 11/2008 | Hendricks et al. | |
| 7,862,634 B2 | 1/2011 | Belnap et al. | |
| 8,349,219 B2 | 1/2013 | Hong et al. | |
| 9,682,425 B2 * | 6/2017 | Xu .......................... | B22F 1/025 |
| 2016/0372228 A1 | 12/2016 | She et al. | |

FOREIGN PATENT DOCUMENTS

WO 2016/007889 A1 1/2016

OTHER PUBLICATIONS

Investigation of the interfacial reaction between multi-walled carbon nanotubes and aluminum, L. Ci et al. / Acta Materialia 54 (2006) 5367-5375.*
Preparation of high thermal conductivity copper-diamond composites using molybdenum carbide-coated diamond particles, Kang et al., J Mater Sci (2013) 48:6133-6140.*
Enhanced mechanical properties and electrical conductivity of graphene nanoplatelets/Cu composites by in situ formation of Mo2C nanoparticles, Guo et al., Materials Science & Engineering A 766 (2019) 1383652.*
Effect of carbide interlayers on the microstructure and properties of graphene-nanoplatelet-reinforced copper matrix composites, Si et al., vol. 708, Dec. 21, 2017, pp. 311-318.*
European Search Report for EP Application No. 18180441.0 dated Oct. 29, 2018.

* cited by examiner

*Primary Examiner* — Haidung D Nguyen
(74) *Attorney, Agent, or Firm* — Carlson, Gaskey & Olds, P.C.

(57) ABSTRACT

A method of forming a bulk product includes the step of coating a particulate conductive phase material with a binder phase, and forming the coated conductive phase material into at least one of sheet stock, tape formed into a bulk material. A method of forming a bulk product includes the step of coating a particulate conductive phase material with a binder phase and forming the coated conductive phase material into a bulk material. The conductive phase material includes at least one of two dimensional materials, single layer materials, carbon nanotubes, boron nitride nanotubes, aluminum nitride and molybdenum disulphide ($MoS_2$). A component is also disclosed.

9 Claims, 1 Drawing Sheet

STRUCTURES FORMED FROM HIGH TECHNOLOGY CONDUCTIVE PHASE MATERIALS

BACKGROUND OF THE INVENTION

This application relates to a method and structures wherein a binder layer is coated onto highly engineered conductive materials.

Modern industrial systems are becoming more and more complex and the challenges are increasing.

As examples, the ability to transmit high voltage and current levels through electric conductors raises challenges for the materials historically utilized.

In addition, heat exchangers are being challenged with higher and higher heat loads. Again the materials which have historically been utilized may not be sufficiently conductive.

Highly engineered modern materials are better equipped to provide the required conductivity. However, in general, such materials are not yet widely available in bulk form appropriate for manufacture of fuel components.

Typically, materials, such as graphene, carbon nanotubes, boron nitride nanotubes, aluminum nitride, or molybdenum disulphide ($MoS_2$) may be examples of such highly engineered materials. Such materials may be available as fibers, nanotubes, whiskers, spheres, platelets, powder, etc. In such particulate shapes, the materials are not easily manufactured into real world components.

SUMMARY OF THE INVENTION

A method of forming a bulk product includes the step of coating a particulate conductive phase material with a binder phase using a deposition coating process. Then the coated conductive phase material is formed into a bulk material.

A method of forming a bulk product includes the step of coating a particulate conductive phase material with a binder phase and forming the coated conductive phase material into a bulk material. The conductive phase material includes at least one of two dimensional (2D) materials, single layer materials, carbon nanotubes, boron nitride nanotubes, aluminum nitride and molybdenum disulphide ($MoS_2$).

A component is also disclosed.

These and other features may be best understood from the following drawings and specification.

DETAILED DESCRIPTION

Figure 1:
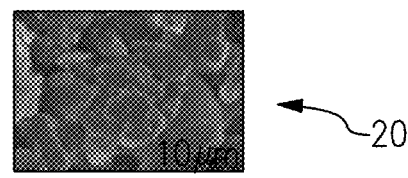
FIG. 1 shows an example of a highly engineered conductive material.

A highly engineered conductive material 20 is illustrated in FIG. 1. As mentioned above, the material may be graphene, carbon nanotubes, boron nitride nanotubes, aluminum nitride, molybdenum disulphide ($MoS_2$), various carbides or nitrides, such as those of Ti and Si, other related materials and mixtures thereof. Also, the materials may be single layer or two-dimensional materials. So-called "2D" materials are crystalline materials formed of a single layer of atoms. While these materials are shown in this figure as powders, they may also be fibers, nanotubes, whiskers, spheres, platelets, etc., including combinations of these. Collectively, these are referred to as particulate conductive phase material.

A particular highly engineered conductive material may be selected based upon a desired application. The conductivity may be electric and/or thermal depending on the final application.

As examples, graphene platelets have extremely high electrical and thermal conductivity in-plane. Aluminum nitride has high thermal conductivity, but very low electrical conductivity. Other properties of these several considered materials are also known.

Figure 2:
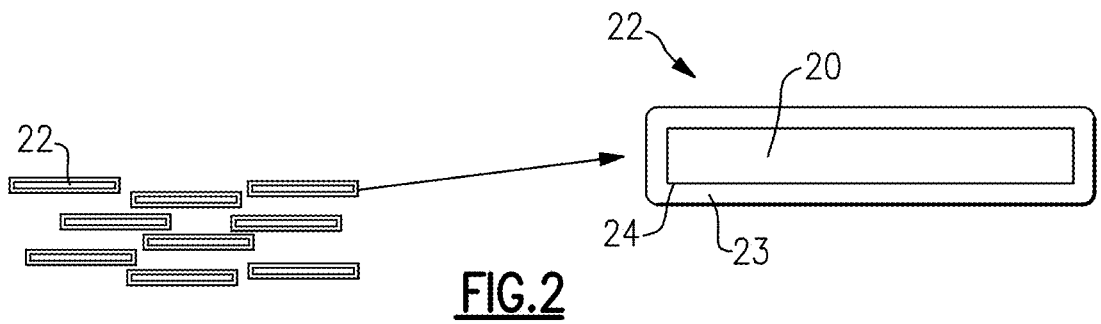
FIG. 2 shows a coating applied to the material.

The particulate conductive materials are coated with a binder phase layer. This is shown in FIG. 2, at 22. The conductive phase material 20 is shown in an inner portion and the binder coating 23 is shown outwardly. Intermediate or interlayers 24 may also be included.

The binder layer is extremely thin and may be provided such as by atomic layer deposition. Other deposition coating processes may be used. Examples of binder layers may be metals, semimetals, intermetallics, metal carbides, metal oxides, etc. The binder layer materials are selected for their capability to preferentially deform or flow with the highly engineered materials during the consolidation step as described below. While metals are generally disclosed as a phase in the binder layer, the binder phase need not be metallic or even conductive. Examples of non-metallic binder phase materials include ceramics, glasses, polymers or composites comprising more than one of these phases.

In some applications, the binder phase may be on the order of 1 nanometer to 100 microns in thickness.

Other potential binder phase coatings include nickel, aluminum, silicon, copper, zinc, tin, gallium and various alloys and other metals. The binder phases are primarily selected as metals for their beneficial thermal and electrical conductivities, subsequent processability, as well as resistance to corrosion in corrosive environments.

The optional interlayer coatings can include one or more metal, metallic carbides or other compounds to enhance wetting of the binder layer, or to provide another beneficial function such as modifying the thermal or electrical conductivity, altering the layer thickness, introducing a reactive phase, controlling the coefficient of thermal expansion and the like.

As one example, a metallic outer coating of copper may be applied as the binder phase on a particulate graphene conductive phase with an interlayer providing wetting enhancement. The interlayer coating may be molybdenum carbide. In this example, the very thin copper layer facilitates forming of the graphene into a more bulk form such as fiber, wire, rod or a larger component structure. This forming may occur via various thermal, mechanical or thermomechanical processes such as sintering, welding, diffusion, pressing, extrusion, injection molding or other suitable metal, ceramic, glass or polymer processing methods. Such an example extends to other metallic carbide interlayers and other transition metal binder phases.

The optional molybdenum carbide wetting layer provides improved binding for the latter processes by facilitating improved wetting of the copper phase(s) onto the graphene. The extremely thin binder layer thus enables extremely high volume manufacture of the highly engineered conductive phase in the final materials.

Figure 3:
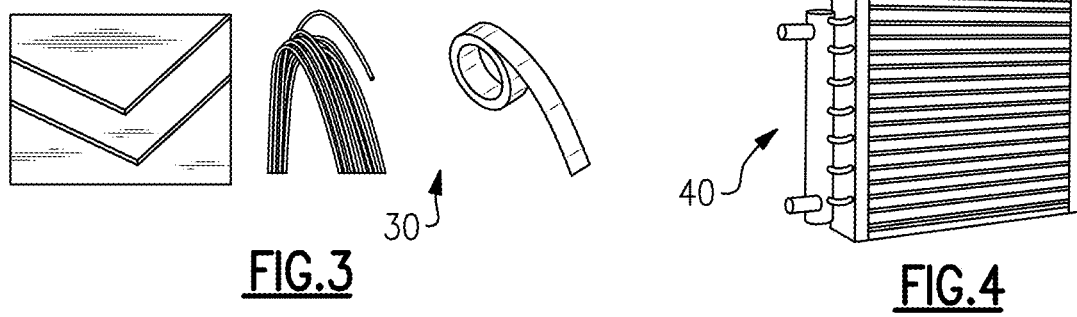
FIG. 3 shows a consolidation stage.
Figure 4:
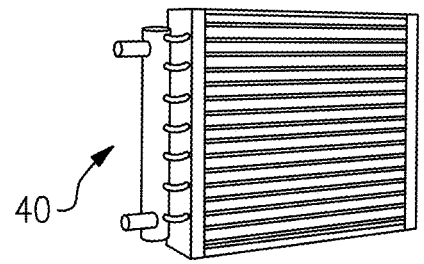
FIG. 4 shows one real world component manufactured by this method.
Figure 5:
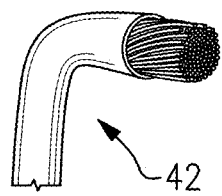
FIG. 5 shows another real world component.
Figure 6:
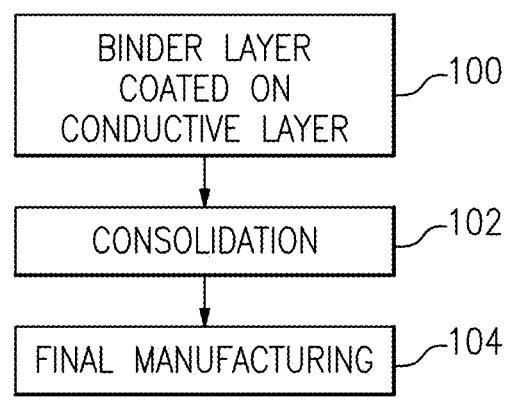
FIG. 6 shows a process flow to create a bulk product using the described method

As shown in FIG. 3, the binder layer coated conductive phases may be consolidated as shown at 30 in FIG. 3 into various bulk forms. Single or multi-step forging, heating and/or pressing, laser or radiative processing or other additive manufacturing methods or combination of these methods may be utilized to form these consolidated bulk materials. The consolidated bulk materials may be sheet stock, tapes, ribbons, wires, or other geometries. While it is generally true that there will be an intermediate consolidation step, this step could form the final product such as a heat exchanger 40 shown in FIG. 4 or strands within an electric cable 42 shown in FIG. 5. However, generally a final forming process occurs from the consolidated bulk materials.

The final product could be said to have at least a portion of a component body formed of a particulate conductive material and coated by a binder phase coating, such that the component includes both binder phase material and the particulate conductive material. The conductive phase materials include at least one of graphene, carbon nanotubes, boron nitride nanotubes, aluminum nitride and molybdenum disulphide ($MoS_2$), various carbides or nitrides, such as those of Ti and Si, other related materials such as refractories, intermetallics and certain glasses and mixtures thereof and the particulate conductive phase materials are in the shape of at least one of a powder, fibers, nanotubes, whiskers, spheres and platelets.

Methods for deposition of the binder coating onto the conductive phase include various deposition processes including physical and chemical vapor deposition, molecular and/or atomic layer deposition as well as other vapor phase, spray, paint, plating, solution dipping, electrostatic or electrophoretic deposition or other suspension deposition methods.

The methods as disclosed above allow the use of the relatively unavailable highly engineered composite phase materials to be utilized to form real world components.

Although methods and structures have been disclosed, a worker of ordinary skill in this art would recognize that certain modifications would come within the scope of this invention. For that reason, the following claims should be studied to determine the true scope and content of this invention.

The invention claimed is:

1. A method of forming a bulk product comprising the step of:
   coating a particulate conductive phase material with a binder phase using a deposition coating process, and forming the coated conductive phase material into a bulk material;
   wherein said particulate conductive phase material includes at least one of two dimensional (2D) materials, single layer materials, graphene, boron nitride nanotubes, aluminum nitride and molybdenum disulphide ($MoS_2$), carbides or nitrides including those of Ti and Si refractories, intermetallics and glasses;
   wherein there is an intermediate layer coating between the conductive phase and the binder phase;
   wherein the intermediate layer coating is a metal carbide and the binder phase is a transition metal;
   wherein the binder phase coating is less than 100 microns thick; and
   wherein said binder phase transition metal is copper, said intermediate layer coating is molybdenum carbide and said particulate conductive phase material is graphene.

2. The method as set forth in claim 1, wherein the particulate conductive phase materials are in the shape of at least one of a powder, fibers, nanotubes, whiskers, spheres, and platelets.

3. The method as set forth in claim 1, wherein the deposition process is one of molecular layer deposition, atomic layer deposition, and vapor phase, spray, paint, plating, solution dipping, electrostatic or electrophoretic deposition or other suspension deposition methods.

4. The method as set forth in claim 3, wherein the binder phase material is selected such that it will facilitate preferential deformation, flow, or bonding with the conductive phase material into the bulk material.

5. The method as set forth in claim 4, wherein the bulk material is at least one of sheet stock, tape, ribbons, wires, or other geometries including a final component.

6. The method as set forth in claim 1, wherein the bulk material is to be utilized as part of a heat exchanger.

7. The method as set forth in claim 1, wherein the bulk material is to be utilized as part of an electrical cable.

8. The method as set forth in claim 1, wherein the bulk material is at least one of sheet stock, tape, ribbons, or wires.

9. The method as set forth in claim 1, wherein said forming of the coated conductive phase material into a bulk material includes one of laser, processes, radiative processes or additive manufacturing, or a combination thereof.

* * * * *